United States Patent
Horio et al.

(10) Patent No.: US 8,786,480 B2
(45) Date of Patent: *Jul. 22, 2014

(54) DATA CONVERSION METHOD BASED ON NEGATIVE β-MAP

(75) Inventors: Yoshihiko Horio, Warabi (JP); Kenya Jinno, Yokohama (JP); Tohru Kohda, Fukuoka (JP); Kazuyuki Aihara, Narashino (JP)

(73) Assignee: Japan Science and Technology Agency, Kawaguchi-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/638,646

(22) PCT Filed: Mar. 22, 2011

(86) PCT No.: PCT/JP2011/001666
§ 371 (c)(1),
(2), (4) Date: Oct. 22, 2012

(87) PCT Pub. No.: WO2011/125297
PCT Pub. Date: Oct. 13, 2011

(65) Prior Publication Data
US 2013/0027239 A1  Jan. 31, 2013

(30) Foreign Application Priority Data
Apr. 6, 2010  (JP) ................ 2010-087474

(51) Int. Cl.
*H03M 1/12*  (2006.01)
(52) U.S. Cl.
USPC .......................... 341/155; 341/143
(58) Field of Classification Search
USPC ................. 341/155, 118, 120, 143, 172, 144
See application file for complete search history.

(56) References Cited

U.S. PATENT DOCUMENTS

| 4,361,893 | A | * | 11/1982 | Bonnerot | 375/245 |
| 4,811,261 | A | * | 3/1989 | Kobayashi et al. | 708/322 |
| 5,519,361 | A | * | 5/1996 | Kim | 332/109 |

FOREIGN PATENT DOCUMENTS

| WO | 2009/014057 A1 | 1/2009 |
| WO | 2010/024196 A1 | 3/2010 |

OTHER PUBLICATIONS

Daubechies, Ingrid, et al, A/D Conversion With Imperfect Quantizers, IEEE Transactions on Information Theory, Mar. 2006, pp. 874-885, vol. 52, No. 3.
Daubechies, I., et al, Beta Expansions: A New Approach to Digitally Corrected A/D Conversion, Circuits and Systems, International Symposium, 2002, pp. II-784-II-787.
Hironaka, S., et al, Markov Chain of Binary Sequences Generated by A/D Conversion Using β-encoder, Proceedings of IEEE Workshop n Nonlinear Dynamics of Electronic Systems, 2007, pp. 261-264, Tokushima, Japan.

(Continued)

*Primary Examiner* — Peguy Jean Pierre
(74) *Attorney, Agent, or Firm* — Bacon & Thomas, PLLC

(57) ABSTRACT

There is provided a data conversion method based on negative β-map suited for an A/D converter or chaos generator, that is adapted to an integrated circuit and capable of providing stable operation of the circuit. The data conversion method based on negative β-map includes a discrete time integrator 1 having an amplification coefficient s and a damping factor β, a quantizer 2 connected in series to the discrete time integrator 1, and a feedback circuit connected from an output of the quantizer 2 to an input of the discrete time integrator 1.

20 Claims, 7 Drawing Sheets

(56) References Cited

OTHER PUBLICATIONS

Hironaka, S. et al, Negative β-encoder, Proceedings of International Symposium on Nonlinear Theory and Its Applications, 2008, pp. 564-567, Budapest, Hungary.

Kohda, T., et al, Negative β-encoder, Journal of Class Files, Preprint, arXiv: 0808.2548v2[cs.IT], Jul. 28, 2009, http://arxiv.org/abs/0808.2548January 2007, pp. 1-19.

International Preliminary Examination Report on Patentability issued in PCT/JP2011/001666 dated Nov. 6, 2012, 4 pages.

* cited by examiner

DATA CONVERSION METHOD BASED ON NEGATIVE β-MAP

BACKGROUND OF THE INVENTION

1. Field of the Invention

The present invention relates to a data conversion method based on negative β-map, and particularly to an A/D converter and a chaos generator using a discrete time integrator for adapting to an integrated circuit.

2. Description of the Related Art

Conventionally, the data conversion method based on negative β-map using a negative real number as the radix has been proposed (see Patent Document 1, and Non-Patent Documents 1 and 2 listed below). In this method, the conversion errors near the ends of tolerance of a threshold are mitigated particularly, over the conventional data conversion methods based on β-map using a positive real radix (see Patent Document 2, and Non-Patent Documents 3 and 4 listed below). This is because while the β-map using a positive real number as the radix provides for the constant size of an invariant subinterval that translates within a domain depending on the value of a threshold parameter, the negative β-map provides for an invariant subinterval positioned substantially at the center of a domain and its size expands or contracts depending on the value of a threshold parameter, allowing a wider dynamic range of a circuit to be obtained for the expanded domain.

Now, detailed description will be provided.

The negative β-map R (•) used in a data converter based on negative β-map is described in Equation (1) (see Patent Document 1, and Non-Patent Documents 1 and 2 listed below).

$$R(x) = \begin{cases} s - \beta x, & x \in [0, \gamma v) \\ \beta s - \beta x, & x \in [\gamma v, s) \end{cases} \quad (1)$$

wherein, $v \in [s(\beta-1), s)$ is a threshold parameter, $-2 < -\beta \leq -1$ is a conversion radix, and $\gamma = 1/\beta$, $s > 0$ is a scaling constant.

Assuming that the discrete time is $t_n$ (n is a natural number), and then by using it to rewrite Equation (1) above as the one-dimensional discrete time dynamical system, it can be described as $$x(t_{n+1}) = R(x(t_n)) = \begin{cases} s - \beta x(t_n), & x(t_n) \in [0, \gamma v) \\ \beta s - \beta x(t_n), & x(t_n) \in [\gamma v, s) \end{cases} \quad (2)$$

An example of the one-dimensional map is shown in FIG. 16. In this figure, $\beta=5/3$, $s=3$, $v=5/2$, and $\gamma v=3/2$. FIG. 16 also illustrates the trajectory with $x(t_1)=0.6$ as an initial value. As shown in FIG. 16, the trajectory is resultantly confined within an invariant subinterval [LB, UB] (the region D in FIG. 16). Here, LB and UB are given in Table 1.

TABLE 1

| Range of v | LB | UB |
|---|---|---|
| $(\beta-1)s \leq v < \dfrac{\beta^2-\beta+1}{\beta+1}s$ | $\beta v - (\beta^2-\beta)s$ | $\beta s - v$ |
| $\dfrac{\beta^2-\beta+1}{\beta+1}s \leq v < \dfrac{2\beta-1}{\beta+1}s$ | $s - v$ | $\beta s - v$ |
| $\dfrac{2\beta-1}{\beta+1}s \leq v < s$ | $s - v$ | $\beta v - (\beta^2-\beta)s$ |

From this table, it is found that the size of the invariant subinterval is maximized when $v=(\beta-1)s$ and $v=s$, where LB=0 and UB=s. That is, the size of the invariant subinterval is maximized when v takes the maximum or minimum value within the tolerance of v, [s (β−1), s). When implementing this map in a circuit, the larger the invariant subinterval is, the wider the dynamic range of the circuit can be, improving the S/N ratio relatively. It should be noted however that the conversion errors vary depending on the value of v (see Patent Document 1, and Non-Patent Documents 1 and 2 listed below). Moreover, the size of invariant subinterval requires to be set up so that the trajectory of the map does not run off the domain [0,s) due to noises or non-ideal characteristics of the circuit.

Next, a binary variable $b(t_n) \in \{0,1\}$ is defined as $$b(t_n) = Q_\theta(x(t_n)) = \begin{cases} 0, & x(t_n) \in [0, \theta) \\ 1, & x(t_n) \in [\theta, s) \end{cases} \quad (3)$$

wherein, $Q_\theta(\cdot)$ is a quantizer with θ as the threshold. Also, the following applies hereinbelow.

$$\theta = \gamma v \quad (4)$$

At this time, Equation (2) above can be described as $$x(t_{n+1}) = \overline{b(t_n)}s + b(t_n)\beta s - \beta x(t_n) = s(\overline{b(t_n)} + \beta b(t_n)) - \beta x(t_n) \quad (5)$$

This equation can be further transformed as $$\begin{aligned} x(t_{n+1}) &= s(\overline{b(t_n)} + \beta b(t_n)) - \beta x(t_n) \quad (6)\\ &= s(\overline{b(t_n)} + (1+\beta-1)b(t_n)) - \beta x(t_n) \\ &= s(\overline{b(t_n)} + b(t_n) + (\beta-1)b(t_n)) - \beta x(t_n) \\ &= s(b(t_n) + b(t_n) + (\beta-1)b(t_n)) - \beta x(t_n) \quad (7) \end{aligned}$$

Here, assume that the input signal $x_{input}$ is sampled at $t=t_1$. That is, $$x(t_1) = x_{input} \quad (8)$$

At this time, by repeating Equation (5) above from $t=t_1$ to $t=t_L$ is a bit length after A/D conversion), the binary signal train BS ($x_{input}$) corresponding to the input signal $x_{input}$ is obtained.

$$BS(x_{input}) = (b_1 b_2 \ldots b_L)_{-\beta,s} \quad (9)$$

wherein, $b_n = b(t_n)$ (n=1, 2, ..., L), $b_L = b(t_L)$ is the LSB (least significant bit), and $b_1 = b(t_1)$ is the MSB (most significant bit).

At this time, in order to obtain a decoded value $\hat{x}_L$ of an original signal from the output bit series of L-bits, $$\hat{x}_L = s\left\{\frac{(-\gamma)^L}{2} - \sum_{i=1}^{L}(b_i\beta + \overline{b_i})(-\gamma)^i\right\} \quad (10)$$

may be applied (see Patent Document 1, and Non-Patent Documents 1 and 2 listed below).

Here, the tolerance $\sigma_v$ of the threshold parameter $v$ of the quantizer $Q_\theta(\cdot)$ is given as follows with s and $\beta$ (see Patent Document 1, and Non-Patent Documents 1 and 2 listed below).

$$\sigma_v = s(2-\beta) \quad (11)$$

This is shown in FIG. 16 as the bold line on the axis $x(t_{n+1})$. Accordingly, the threshold $\theta$ of the quantizer is allowed to vary within the range described as follows (see Patent Document 1, and Non-Patent Documents 1 and 2 listed below).

$$\sigma_\theta = \gamma \sigma_v = \gamma s(2-\beta) = s(2\gamma - 1) \quad (12)$$

This is shown in FIG. 16 as the bold line on the axis $x(t_n)$. That is, even when the quantization threshold $\theta$ varies due to the change in environment, non-ideal characteristics of circuit elements, or noises, the A/D converter circuit operates normally as long as $\theta$ remains within the range described in Equation (12) above. In other words, the A/D converter circuits that operate normally can be realized, even with the simple and inexpensive circuit configuration where the quantization threshold $\theta$ may vary.

The configuration diagrams of the A/D converter based on negative $\beta$-map are shown in Patent Document 1, and Non-Patent Documents 1 and 2 listed below. FIG. 17 shows a configuration diagram of the A/D converter based on negative $\beta$-map. However, the as-is configuration is not suitable for integrated circuits.

Patent Document 1: WO 2010/024196
Patent Document 2: WO 2009/014057
Non-Patent Document 1: S. Hironaka, T. Kohda, and K. Aihara, "Negative $\beta$-encoder", in Proceedings of International Symposium on Nonlinear Theory and Its Applications, pp. 564-567, Budapest, Hungary, 2008
Non-Patent Document 2: T. Kohda, S. Hironaka, and K. Aihara, "Negative $\beta$-encoder", Preprint, arXiv: 0808.2548v2[cs.IT], 28 Jul. 2009, http://arxiv.org/abs/0808.2548
Non-Patent Document 3: T. Daubechies, R. A. DeVore, C. S. Gunturk, and V. A. Vaishampayan, "A/D conversion with imperfect quantizers", IEEE Transactions on Information Theory, Vol. 52, No. 3, pp. 874-885, 2006
Non-Patent Document 4: S. Hironaka, T. Kohda, and K. Aihara, "Markov chain of binary sequences generated by A/D conversion using $\beta$-encoder", in Proceedings of IEEE Workshop on Nonlinear Dynamics of Electronic Systems, pp. 261-264, Tokushima, Japan, 2007

SUMMARY OF THE INVENTION

As described above, there has been a problem that the conventional A/D converters based on negative $\beta$-map are not suitable for integrated circuits.

In addition, although the chaos generators using Bernoulli map or Tent map have been proposed as the circuits for generating chaos having uniform distribution of the invariant measure, these circuits have a disadvantage that, when the solution trajectory contacts the ends of a domain, it diverges due to non-ideal characteristics or noises of the circuit, resulting in the unstable operation.

In view of the circumstances described above, the present invention is directed to provide a data conversion method based on negative $\beta$-map configured using a discrete time integrator, adapted to integrated circuits and suitable for chaos generators.

As a specific assembly, there is provided an A/D converter circuit based on negative $\beta$-map using a switched capacitor (SC) circuit.

In addition, a chaos generator is proposed that is robust for mismatches or noises of circuit elements and operates stably without trajectory divergence, by extending the bit length of the above-mentioned A/D converter based on negative $\beta$-map to the infinite because of the fact that the trajectory of the negative $\beta$-map is resultantly confined within a finite invariant subinterval. The proposed chaos generator allows realization of different chaos attractors readily only by changing circuit parameters.

Moreover, the specification checks the operations of the above-mentioned A/D converter circuit based on negative $\beta$-map and the chaos generator applying thereof to explain their validity by the SPICE (Simulation Program with Integrated Circuit Emphasis) circuit simulation using ideal circuit elements.

In order to achieve the above-described objects, the present invention provides the following:

[1] A data conversion method based on negative $\beta$-map including a discrete time integrator, a quantizer connected in series to the discrete time integrator, and a feedback circuit including a coefficient multiplier connected from an output of the quantizer to an input of the discrete time integrator.

[2] The data conversion method based on negative $\beta$-map according to [1] above, wherein an A/D converter is configured of the discrete time integrator having an amplification coefficient s and a damping factor $\beta$, and the quantizer $Q_\theta(\cdot)$, the feedback circuit thereof comprising a $\beta$ coefficient multiplier and a logic inverter.

[3] The data conversion method based on negative $\beta$-map according to [1] above, wherein an A/D converter is configured of the discrete time integrator having a damping factor $\beta$, and the quantizer $Q_\theta^S(\cdot)$, the feedback circuit thereof comprising a $\beta$ coefficient multiplier and a logic inverter.

[4] The data conversion method based on negative $\beta$-map according to [1] above, wherein an A/D converter is configured of the discrete time integrator having an amplification coefficient s and a damping factor $\beta$, and the quantizer $Q_\theta(\cdot)$, the feedback circuit thereof comprising a ($\beta-1$) coefficient multiplier.

[5] The data conversion method based on negative $\beta$-map according to [1] above, wherein an A/D converter is configured of the discrete time integrator having a damping factor $\beta$, and the quantizer $Q_\theta^S(\cdot)$, the feedback circuit thereof comprising a ($\beta-1$) coefficient multiplier.

[6] The data conversion method based on negative $\beta$-map according to any one of [2] to [5] above, wherein the A/D converter is implemented using a switched capacitor integrator circuit.

[7] The data conversion method based on negative $\beta$-map according to any one of [2] to [5] above, wherein the A/D converter is configured as a chaos generator by extending a bit length L thereof to the infinite.

[8] The data conversion method based on negative $\beta$-map according [7] above, wherein a chaotic time series having an initial value $x_{input}$ is obtained by operating an A/D converter based on negative $\beta$-map R ($\cdot$) to sample an input signal $x_{input}$ at discrete time $t_1$, and repeat the mapping L-times to obtain a conversion bit series BS ($x_{input}$) having the bit length L, and by extending the bit length to the infinite (L=$\infty$) in the operation.

[9] The data conversion method based on negative $\beta$-map according to [8] above, wherein, if the initial value is not required to be set up, $-\infty < n < \infty$ at the discrete time $t_n$ is provided wherein the circuit subjected to sampling of the input signal is eliminated to configure a compact chaos generator.

Effect of the Invention

According to the present invention, the effects as follows can be provided.

(1) The A/D converter based on negative β-map is configured using the discrete time integrator which is a core circuit element in the analog integrated circuit technology and used in most of the integrated circuits. Thus, the A/D converter of the present invention is suitable for circuit integration.

(2) The A/D converter employing the data conversion method based on negative β-map is configured as the chaos generator. A solution trajectory of a negative β-map is resultantly confined within a finite invariant subinterval, so that the chaos generator of the present invention is robust for non-ideal characteristics of the circuit elements or noises and operates stably.

DESCRIPTION OF THE PREFERRED EMBODIMENTS

Figure 1:
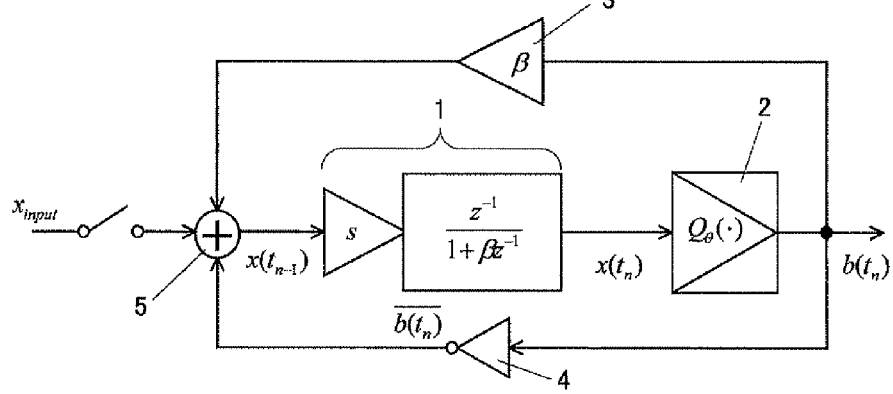
FIG. 1 is a configuration diagram of an A/D converter based on negative β-map, illustrating a first embodiment of the present invention.

A data conversion method using a negative β-map of the present invention includes a discrete time integrator, a quantizer connected in series to the discrete time integrator, and a feedback circuit including a coefficient multiplier connected from an output of the quantizer to an input of the discrete time integrator.

EMBODIMENTS

Hereinbelow, the embodiments of the present invention will be described in detail.

For a data conversion method based on negative β-map of the present invention, an A/D converter using a negative β-map configured using a discrete time integrator will be described.

The discrete time integrators are used mostly as a major component of an analog integrated circuit. The reasons include that the availability of circuit configuration that is less sensitive to non-ideal characteristics and mismatches of the elements, parasitic elements, or noises, and the ability to further improve the circuit performance with fully-differential circuits. In addition, switched capacitor (SC) circuits, switched current (SI) circuits, and the like are proposed as the integrated circuit technology for discrete time integrator circuits, and the vast knowledge about such circuits has been provided. The availability of such useful data is one of the reasons why the discrete time integrators are used. Therefore, there is proposed the data conversion method based on, negative β-map wherein the A/D converter using a negative β-map is configured with the discrete time integrator.

First, the configuration of the A/D converter based on Equation (5) above will be described.

Z transformation of Equation (5) above can result in $$X(z) = s(\overline{B(z)} + \beta B(z))z^{-1} - \beta X(z)z^{-1} \quad (13)$$

wherein, X(z), B(z), and $\overline{B(z)}$ are variables of $x(t_n)$, $b(t_n)$, and $\overline{b(t_n)}$ in Z domain, respectively. Moreover, Equation (3) results in $$B(z) = Q_\theta(X(z)) \quad (14)$$

$$\overline{B(z)} = \overline{Q_\theta(X(z))}$$

and then, the following can be obtained.

$$X(z) = s(\overline{Q_\theta(X(z))} + \beta Q_\theta(X(z)))z^{-1} - \beta X(z)z^{-1} \quad (16)$$

Thereby, $$(1+\beta z^{-1})X(z) = s(\beta Q_\theta(X(z)) + \overline{Q_\theta(X(z))})z^{-1} \quad (17)$$

and resultantly, the following can be obtained.

$$X(z) = s \cdot \frac{z^{-1}}{1+\beta z^{-1}} \cdot (\beta Q_\theta(X(z)) + \overline{Q_\theta(X(z))}) \quad (18)$$

FIG. 1 is a configuration diagram of an A/D converter based on negative β-map, illustrating an embodiment of the present invention.

In this figure, reference numeral 1 denotes a discrete time integrator, and 2 denotes a quantizer connected in series to the discrete time integrator 1, where an output of the quantizer 2 is connected with a β coefficient multiplier 3 and a logic inverter 4 that are connected to an input of the discrete time integrator 1. Reference numeral 5 denotes an adder connected to the β coefficient multiplier 3 and the logic inverter 4.

As shown in FIG. 1, it is found that the A/D converter using the negative β-map can be realized with the discrete time integrator 1 having an amplification coefficient s and a damping factor β, the quantizer 2 [$Q_\theta(\cdot)$], the β coefficient multiplier 3, and the logic inverter 4. However, an output bit series is given by Equation (9) above.

On the other hand, if the quantizer $Q_\theta^S(\cdot)$ that takes a binary {0,s} as its output value is defined as $$Q_\theta^S(\cdot) \equiv s \times Q_\theta(\cdot) \qquad (19)$$

Equation (18) above can be rewritten as $$X(z) = \frac{z^{-1}}{1+\beta z^{-1}} \cdot \left(\beta Q_\theta^S(X(z)) + \overline{Q_\theta^S(X(z))}\right) \qquad (20)$$

Figure 2:
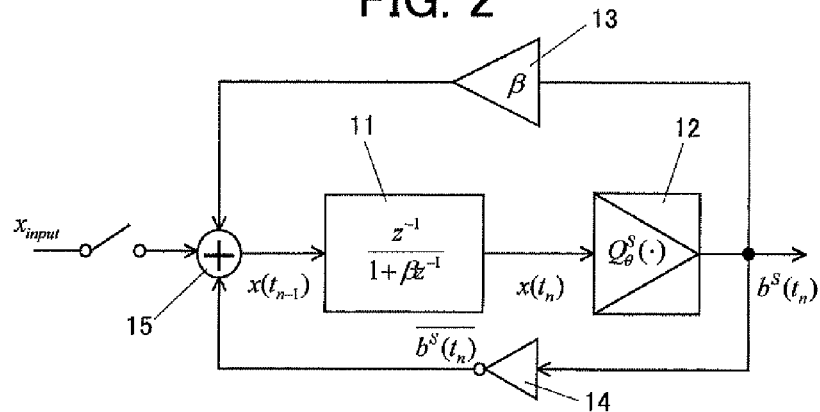
FIG. 2 is a configuration diagram of the A/D converter based on negative β-map, illustrating a second embodiment of the present invention.

In this case, the A/D converter using the negative β-map is configured as shown in FIG. 2.

FIG. 2 is a configuration diagram of the A/D converter based on negative β-map, illustrating a second embodiment of the present invention, the A/D converter being configured of a discrete time integrator 11 having a damping factor β, a quantizer 12 [$Q_\theta^S(\cdot)$] connected in series to the discrete time integrator 11, and a β coefficient multiplier 13 and a logic inverter 14 that are connected from an output of the quantizer 12 to an input of the discrete time integrator 11. In this case, an amplitude of an output bit series $b_n^S$ is (0,s). That is, $$b_n^S = s \cdot b_n = b^S(t_n) = Q_\theta^S(x(t_n)) \qquad (21)$$

Next, the configuration of the A/D converter based on Equation (6) above will be described.

Z transformation of Equation (6) above results in $$\begin{aligned} X(z) &= s(\overline{B(z)}z^{-1} + B(z)z^{-1} + (\beta-1)B(z)z^{-1}) - \beta X(z)z^{-1} \qquad (22)\\ &= s(\overline{B(z)} + B(z) + (\beta-1)B(z)) - \beta X(z)z^{-1}\\ &= s\{1 + (\beta-1)B(z)\}z^{-1} - \beta X(z)z^{-1}\\ &= s\{1 + (\beta-1)Q(X(z))\}z^{-1} - \beta X(z)z^{-1} \end{aligned}$$

Thereby, $$(1+\beta z^{-1})X(z) = s\{(\beta-1)Q(X(z))+1\}z^{-1} \qquad (23)$$

and resultantly, the following can be obtained.

$$X(z) = s \cdot \frac{z^{-1}}{1+\beta z^{-1}} \cdot \{(\beta-1)Q(X(z))+1\} \qquad (24)$$

Figure 3:
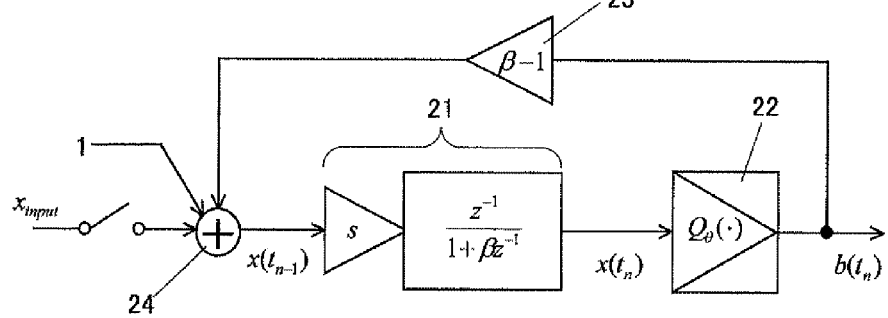
FIG. 3 is a configuration diagram of the A/D converter based on negative β-map, illustrating a third embodiment of the present invention.

Thus, the A/D converter using the negative β-map as described in this manner is configured as shown in FIG. 3.

FIG. 3 is a configuration diagram of the A/D converter based on negative β-map, illustrating a third embodiment of the present invention, the A/D converter being configured of a discrete time integrator 21 having an amplification coefficient s and a damping factor β, a quantizer 22 [$Q_\theta(\cdot)$] connected in series to the discrete time integrator 21, and a (β−1) coefficient multiplier 23 connected from an output of the quantizer 22 to an input of the discrete time integrator 21. Here, reference numeral 24 denotes an adder connected with the (β−1) coefficient multiplier 23.

In addition, by introducing the quantizer as described in Equation (19) above, Equation (24) results in $$X(z) = \frac{z^{-1}}{1+\beta z^{-1}} \cdot \{(\beta-1)Q_\theta^S(X(z)) + s\} \qquad (25)$$

Figure 4:
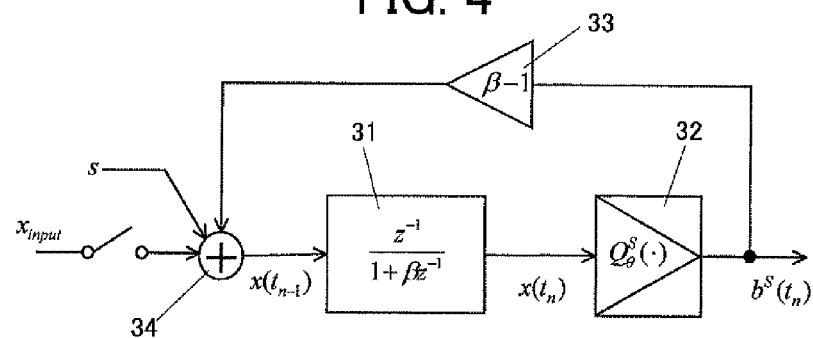
FIG. 4 is a configuration diagram of the A/D converter based on negative β-map, illustrating a fourth embodiment of the present invention.

The A/D converter using the negative β-map as described in this manner is configured as shown in FIG. 4.

FIG. 4 is a configuration diagram of the A/D converter based on negative β-map, illustrating a fourth embodiment of the present invention, the A/D converter being configured of a discrete time integrator 31 having a damping factor β, a quantizer 32 [$Q_\theta^S(\cdot)$] connected in series to the discrete time integrator 31, and a (β−1) coefficient multiplier 33 connected from an output of the quantizer 32 to an input of the discrete time integrator 31. Here, reference numeral 34 denotes an adder connected with the (β−1) coefficient multiplier 33. In this regard, the resulting bit series is as described in Equation (21) above.

Next, a chaos generator employing the data conversion method based on negative β-map will be described.

As described above, there has been a problem with the previously proposed chaos generators using Bernoulli map or Tent map that, when the solution trajectory contacts the ends of a domain, it diverges due to non-ideal characteristics or noises of the circuit, resulting in the unstable operation. Thus, the chaos generator that operates stably is proposed herein, utilizing the fact that the solution trajectory of a negative β-map R (•) is resultantly confined within a finite invariant subinterval.

Figure 16:
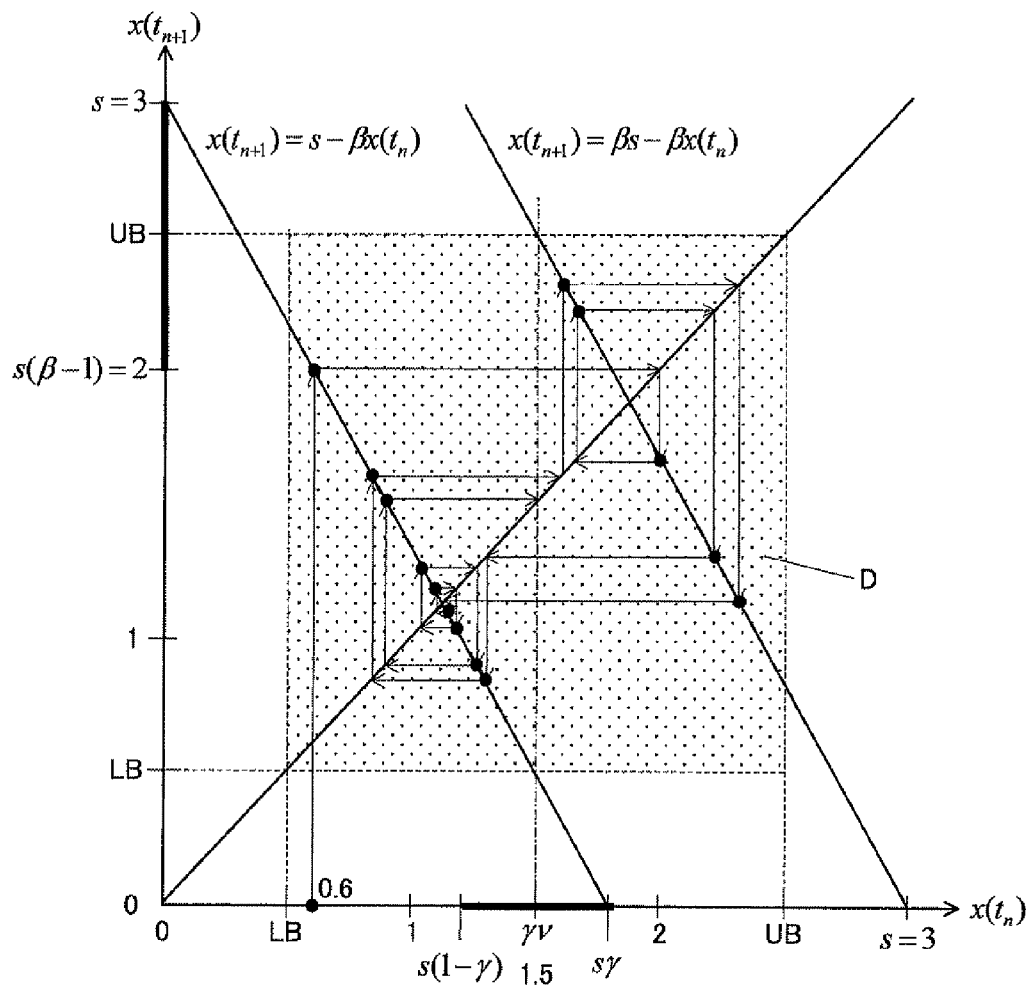
FIG. 16 shows an exemplary negative β-map.
Figure 17:
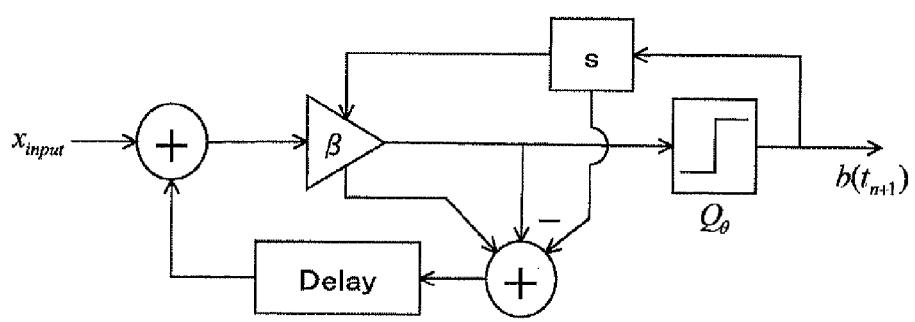
FIG. 17 is a configuration diagram of a conventional A/D converter based on negative β-map.

The solution trajectory of the negative β-map R (•) is, after the transient states, trapped in an invariant subinterval [LB, UB) shown as D in FIG. 16. Thus, if that the width of trajectory shift due to non-ideal characteristics of the circuit element or noises is defined as $\delta_{deviation}$, the solution trajectory does not contact the ends (0 and s) of a domain $x(t_n)$ by selecting ν values to be LB+$\delta_{deviation}$<x($t_n$)<UB−$\delta_{deviation}$. As such, the solution trajectory does not diverge due to the effect of non-ideal characteristics or noises of the circuit, and the chaos generator operates stably. In addition, invariant measure is distributed uniformly in the invariant subinterval of a chaos trajectory realized by the negative β-map R (•), so that the resultant chaotic time series is considered to be readily applied to random number generation, encryption, and the like.

Next, a method of configuring the chaos generator with the negative β-map R (•) will be described specifically.

In the A/D converter based on negative β-map R (•) described above, the operation of sampling the input signal $x_{input}$ at the discrete time $t_1$ and repeating the mapping L-times result in a conversion bit series BS ($x_{input}$) having a bit length of L. In this operation, extending the bit length to the infinite (L=∞) enables obtaining the chaotic time series having an initial value of $x_{input}$. Thereby, the A/D converter using the negative β-map utilizing the discrete time integrator described above can be applied as is as the chaos generator. In addition, if the initial value is not required to be set up, −∞<n<∞ may be applied at the discrete time $t_n$. In this case, the A/D converter based on negative β-map utilizing the discrete time integrator described above can eliminate the element for sampling the input signal, so that the more compact chaos generator can be realized.

Next, as an embodiment of the present invention, an exemplary circuit of the A/D converter based on negative β-map utilizing the switched capacitor (SC) will be described.

The major technology of discrete time analog circuits (sampled data circuits) includes the SC circuits and the SI (switched current) circuits. Here, a method will be described to realize the A/D converter circuit based on β-map utilizing the SC circuit. In this regard, note that the circuit can also be realized in a similar manner using the SI circuit. Specifically, the method will be described to implement the A/D converter circuit using the negative β-map given in Equation (18) and FIG. 1, Equation (20) and FIG. 2, Equation (24) and FIG. 3, or otherwise Equation (25) and FIG. 4, utilizing an SC integrator circuit.

[1] Circuit example 1 utilizing SC circuit: the case using Equation (18) and FIG. 1

Figure 5:
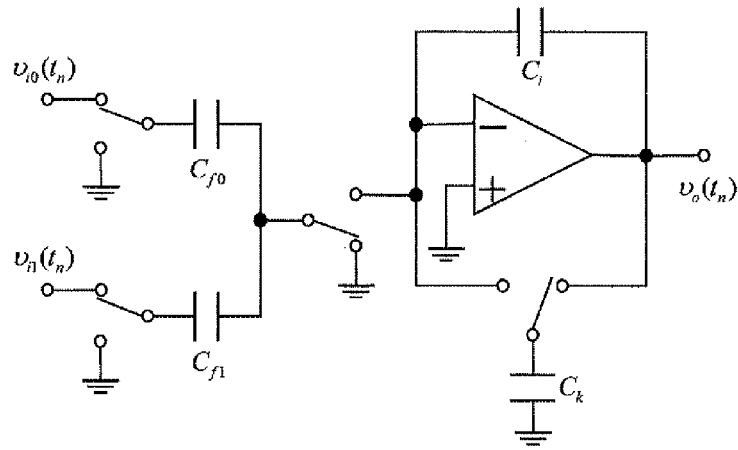
FIG. 5 shows a typical switched capacitor integrator circuit.

FIG. 5 shows a typical switched capacitor (SC) integrator circuit. The transfer function in the Z domain of this circuit is given by $$V_o(z) = \frac{z^{-1}}{1 + \left(\frac{C_k}{C_i} - 1\right)z^{-1}} \cdot \left(\frac{C_{f0}}{C_i} V_{i0}(z) + \frac{C_{f1}}{C_i} V_{i1}(z)\right) \quad (26)$$

Where, $V_o(z)$, $V_{i0}(z)$, and $V_{i1}(z)$ are variables of $v_o(t_n)$, $v_{i0}(t_n)$, and $v_{i1}(t_n)$ in the Z domain, respectively. It is found from comparison between Equations (18) and (26) that Equation (18) above can be realized based on the circuit as shown in FIG. 5 by applying $$V_o(z) = X(z) \quad (27)$$

$$V_{i0}(z) = Q_\theta(X(z)) \quad (28)$$

$$V_{i1}(z) = \overline{Q_\theta(X(z))} \quad (29)$$

$$C_{f0}/C_i = s\beta \quad (30)$$

$$C_{f1}/C_i = s \quad (31)$$

$$C_k/C_i = \beta + 1 \quad (32)$$

Figure 6:
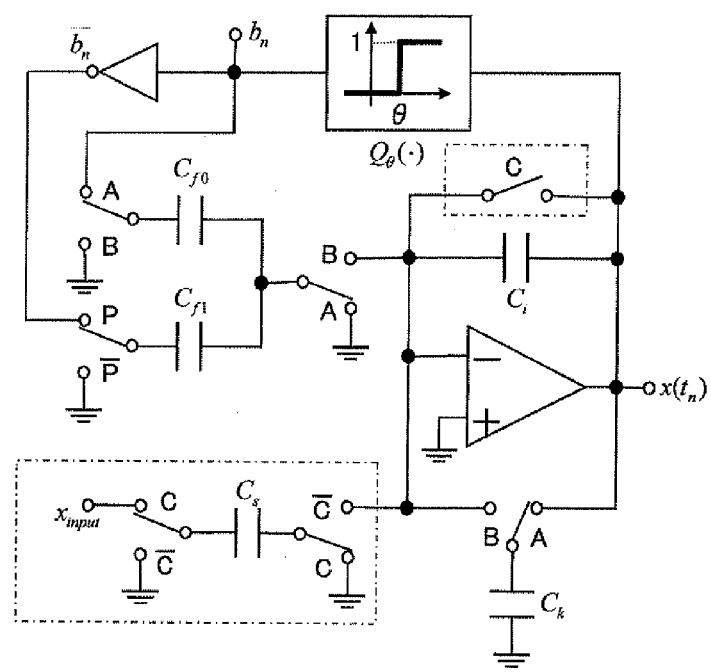
FIG. 6 is a configuration diagram of a first A/D converter based on negative β-map using the switched capacitor integrator circuit of the present invention.

In this regard, since the circuit in FIG. 5 does not include a circuit to input the input signal $x_{input}$, there is a need to add a circuit in FIG. 5 to sample the input signal. FIG. 6 shows a circuit with such an additional circuit, along with the quantizer $Q_\theta(\cdot)$ inserted into the feedback path.

FIG. 6 is a configuration diagram of a first A/D converter based on negative β-map using a switched capacitor integrator circuit of the present invention.

FIG. 6 shows the SC circuit that realizes the A/D converter based on negative β-map as represented in Equation (18) and FIG. 1, where $\phi P = \phi A \cdot \overline{\phi C}$. Here, the regions enclosed by the alternate long and short dash lines may be eliminated when applying to the chaos generator that does not require the set-up of the initial value, where $\phi P = \phi A$ may be applied.

Figure 7:
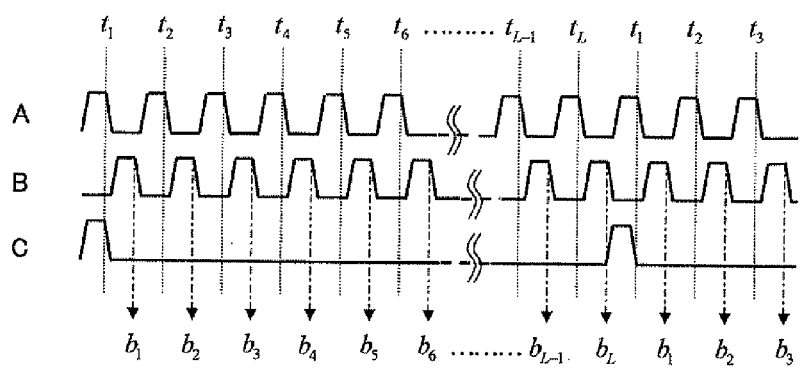
FIG. 7 is a waveform diagram of a three-phase clock to drive a circuit according to the present invention.

Moreover, FIG. 7 shows clocks $\phi A$ and $\phi B$ to drive the circuit shown in FIGS. 6 and 8 to 12, as well as a clock $\phi C$ to simultaneously sample the input signal and reset initial charge of $C_i$.

In this figure, L denotes a bit length, and the output bit series $b_n$ is sampled at the falling edge of $\phi B$, i.e. $t_{n+1/2}$.

Here, if the input signal is sampled according to Equation (8) above, a most significant bit $b_1$ is $$b_1 = b(t_1) = Q_\theta(x(t_1)) = Q_\theta(x_{input}) \quad (33)$$

On the other hand, when the input signal is sampled at $t_1$ as shown in FIG. 7 and $b_1$ is output at $t_{1+1/2}$ in the circuit in FIG. 6, the transfer function of the circuit in that case is $$b_1 = b(t_{1+1/2}) = Q_\theta\left(\frac{C_s}{C_i} \cdot x_{input}\right) \quad (34)$$

By comparing Equations (33) and (34) above, it can be found that, if the input signal is sampled according to Equation (8) above in the circuit in FIG. 6, $$C_s/C_i = 1$$

may be applied.

[2] Circuit example 2 utilizing SC circuit: the case using Equation (20) above and FIG. 2

In the circuit shown in FIG. 6, $C_{f0}$ has to depend on a product of s and β as described in Equation (30) above. Therefore, the circuit shown in FIG. 6 is modified using Equation (20) above to determine the circuit parameter only depending on either s or β. By comparing Equations (20) and (26), the following can be obtained.

$$V_o(z) = X(z) \quad (36)$$

$$V_{i0}(z) = Q_\theta^S(X(z)) \quad (37)$$

$$V_{i1}(z) = \overline{Q_\theta^S(X(z))} \quad (38)$$

$$C_{f0}/C_i = \beta \quad (39)$$

$$C_{f1}/C_i = 1 \quad (40)$$

$$C_k/C_i = \beta + 1 \quad (41)$$

Figure 8:
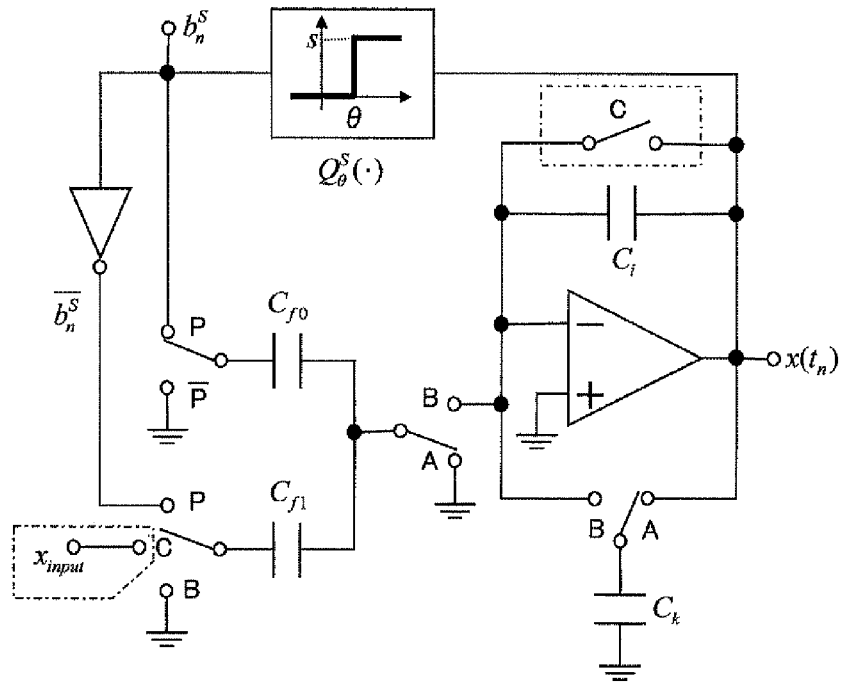
FIG. 8 is a configuration diagram of a second A/D converter based on negative β-map using the switched capacitor integrator circuit of the present invention.

FIG. 8 shows an SC circuit configured based thereon.

FIG. 8 is a configuration diagram of a second A/D converter based on negative β-map using the switched capacitor integrator circuit of the present invention.

FIG. 8 shows the SC circuit that realizes the A/D converter based on negative β-map as represented in Equation (20) and FIG. 2, where $\phi P = \phi A \cdot \overline{\phi C}$. Here, the regions enclosed by the alternate long and short dash lines may be eliminated when applying to the chaos generator that does not require the set-up of the initial value, where $\phi P = \phi A$ may be applied.

In this figure, there is a need to add $C_s$ obtained by Equation (35) above to sample the input signal $x_{input}$, as in FIG. 6. However, since it is known that $C_{f1} = C_s$ from Equations (35) and (40) above, $C_{f1}$ and $C_s$ can share the function as shown in FIG. 8.

Figure 9:
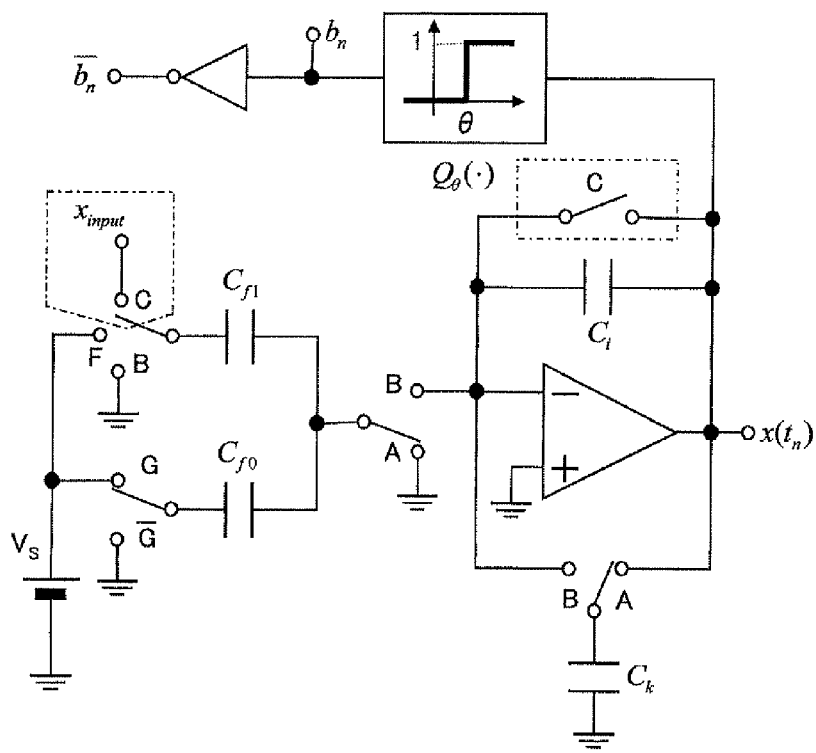
FIG. 9 is a configuration diagram of a variation of the second A/D converter based on negative β-map using the switched capacitor integrator circuit of the present invention.

FIG. 9 shows a circuit having the configuration based on Equation (20) above, while it does not use the quantizer $Q_\theta^S(\cdot)$ and the circuit parameter only depends on either s or β.

FIG. 9 is a configuration diagram of a variation of the second A/D converter based on negative β-map using the switched capacitor integrator circuit of the present invention.

While this circuit is configured based on that shown in FIG. 8, it controls switches on the inputs of the switched capacitors $C_{f0}$ and $C_{f1}$ using the output of the quantizer $Q_\theta(\cdot)$, rather than feeding back the output of the quantizer $Q_\theta(\cdot)$ directly. In addition, a voltage source $V_s$ realizes s. That is, $$V_s = sV \quad (42)$$

In addition, signals F and G to control the switches in FIG. 9 are as follows.

$$F = \overline{b_n} \cdot \phi A \cdot \overline{\phi C} \quad (43)$$

$$G = b_n \cdot \phi A \quad (44)$$

Moreover, $C_{f0}$, $C_{f1}$, and $C_k$ are given by Equations (39), (40), and (41) above, respectively. Here, the regions enclosed by the alternate long and short dash lines may be eliminated when applying to the chaos generator that does not require the set-up of the initial value, where $F = \overline{b_n} \cdot \phi A$ may be applied.

[3] Circuit example 3 utilizing SC circuit: the case using Equation (24) above and FIG. 3

Figure 10:
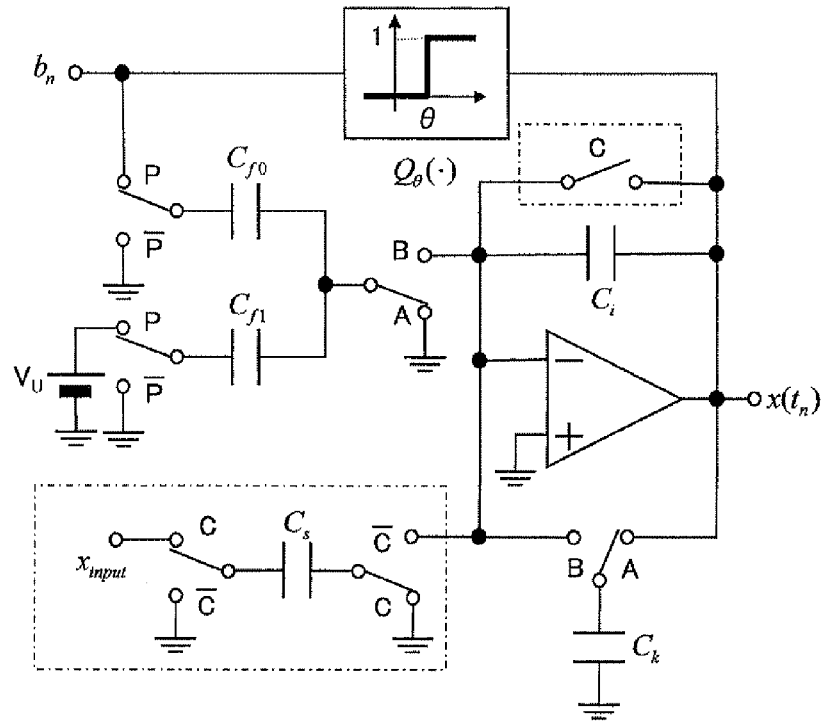
FIG. 10 is a configuration diagram of a third A/D converter based on negative β-map using the switched capacitor integrator circuit of the present invention.

It is found from comparison between Equations (24) and (26) above that, if $$V_o(z) = X(z) \qquad (45)$$

$$V_{i0}(z) = Q_\theta(X(z)) \qquad (46)$$

$$V_{i1}(z) = 1 \qquad (47)$$

$$C_{f0}/C_i = s(\beta - 1) \qquad (48)$$

$$C_{f1}/C_i = s \qquad (49)$$

$$C_k/C_i = \beta + 1 \qquad (50)$$

are applied, Equation (24) above can be realized utilizing the SC integrator circuit shown in FIG. 5. FIG. 10 shows a circuit including the switched capacitor circuit ($C_s$) to sample the input signal.

FIG. 10 is a configuration diagram of a third A/D converter based on negative β-map using the switched capacitor integrator circuit of the present invention.

FIG. 10 shows the SC circuit that realizes the A/D converter based on negative β-map as represented in Equation (24) and FIG. 3, where $\phi P = \phi A \cdot \overline{\phi C}$ and $$C_s/C_i = 1 \qquad (51)$$

$$V_U = 1 \text{ V} \qquad (52)$$

Here, the regions enclosed by the alternate long and short dash lines may be eliminated when applying to the chaos generator that does not require the set-up of the initial value, where $\phi P = \phi A$ may be applied.

[4] Circuit example 4 utilizing SC circuit: the case using Equation (25) above and FIG. 4

In the circuit shown in FIG. 10, the value of $C_{f0}$ has to depend on both s and β as described in Equation (48) above, introducing the constraint on the degree of freedom of the circuit design. Therefore, by using Equation (25) above, the circuit configuration is proposed here, wherein the circuit parameter only depends on either s or β.

Figure 11:
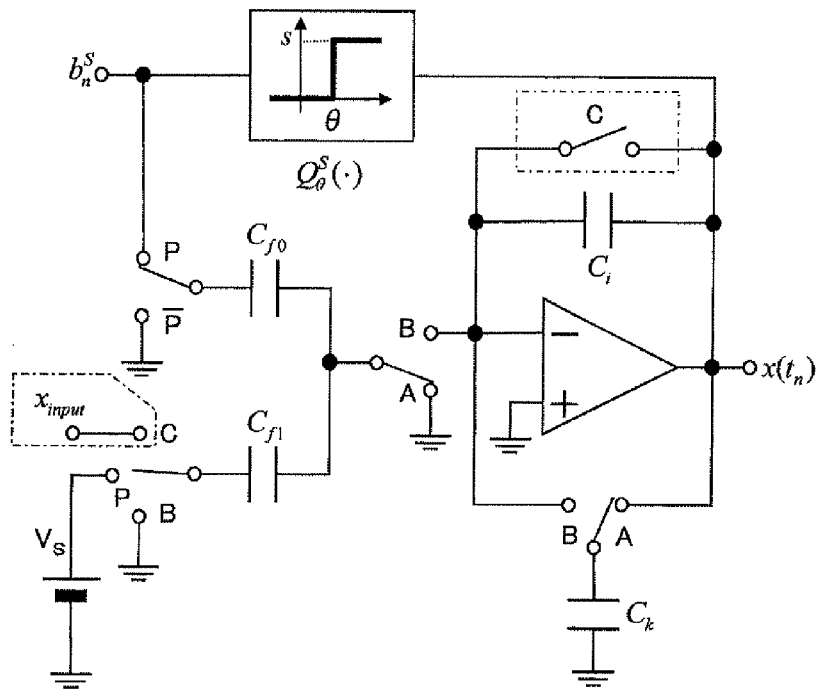
FIG. 11 is a configuration diagram of a fourth A/D converter based on negative β-map using the switched capacitor integrator circuit of the present invention.

It is found from comparison between Equations (25) and (26) above that, if $$V_o(z) = X(z) \qquad (53)$$

$$V_{i0}(z) = Q_\theta^S(X(z)) \qquad (54)$$

$$V_{i1}(z) = s \qquad (55)$$

$$C_{f0}/C_i = \beta - 1 \qquad (56)$$

$$C_{f1}/C_i = 1 \qquad (57)$$

$$C_k/C_i = \beta + 1 \qquad (58)$$

are applied, Equation (25) above can be realized utilizing the SC integrator circuit shown in FIG. 5. FIG. 11 shows an overall circuit.

FIG. 11 is a configuration diagram of a fourth A/D converter based on negative β-map using the switched capacitor integrator circuit of the present invention.

FIG. 11 shows the SC circuit that realizes the A/D converter based on negative β-map as represented in Equation (25) and FIG. 4, where $\phi P = \phi A \cdot \overline{\phi C}$. In the circuit shown in FIG. 11, $$V_s = sV \qquad (59)$$

Moreover, since $C_s/C_i = 1$ applies if the capacitor to sample the input signal is $C_s$, it can be eliminated by sharing its function with $C_{f1}$ as shown in FIG. 11, from Equation (57) above. Here, the regions enclosed by the alternate long and short dash lines may be eliminated when applying to the chaos generator that does not require the set-up of the initial value, where $\phi P = \phi A$ is applied.

Figure 12:
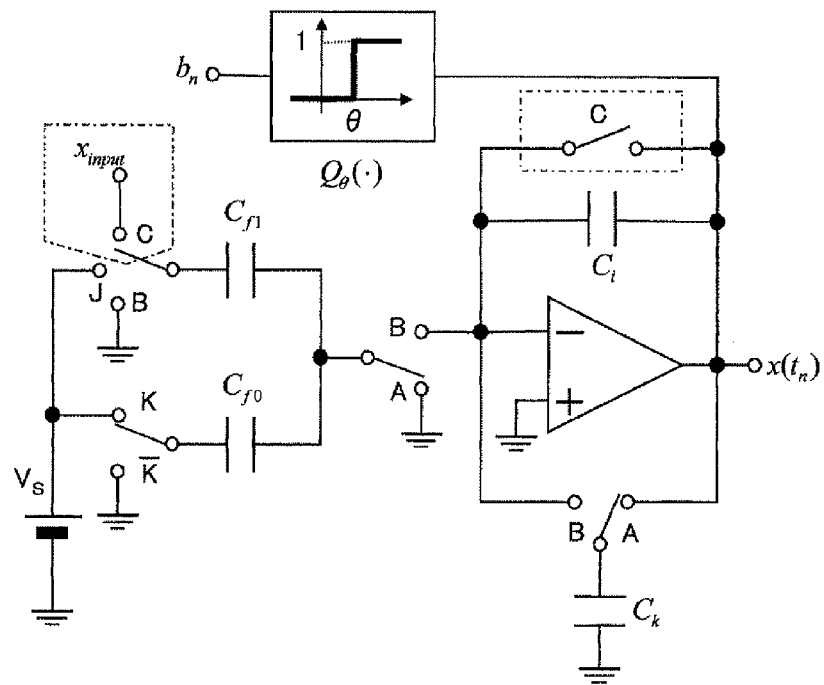
FIG. 12 is a configuration diagram of a variation of the fourth A/D converter based on negative β-map using the switched capacitor integrator circuit of the present invention.

FIG. 12 shows a circuit having the configuration based on Equation (25) above, while it does not require the quantizer $Q_\theta^S(\bullet)$ and the circuit parameter only depends on either s or β.

FIG. 12 is a configuration diagram of a variation of the fourth A/D converter based on negative β-map using the switched capacitor integrator circuit of the present invention.

While this circuit is configured based on that shown in FIG. 11, it controls switches on the inputs of the switched capacitors $C_{f0}$ and $C_{f1}$ using the output of the quantizer $Q_\theta(\bullet)$, rather than feeding back the output of the quantizer $Q_\theta(\bullet)$ directly. In addition, the voltage source Vs realizes s. That is, $$V_s = sV \qquad (60)$$

In addition, signals J and K to control the switches in FIG. 12 are as follows.

$$J = \phi A \cdot \overline{\phi C} \qquad (61)$$

$$K = b_n \cdot \phi A \qquad (62)$$

Moreover, $C_{f0}$, $C_{f1}$, and $C_k$ are given by Equations (56), (57), and (58) above, respectively. Here, the regions enclosed by the alternate long and short dash lines may be eliminated when applying to the chaos generator that does not require the set-up of the initial value, where $J = \phi A$ may be applied.

All of the A/D convertor circuits based on negative β-map proposed above can be used as is as the chaos generators by extending the bit length L to the infinite. That is, the interval of $\phi C$ in FIG. 7 may be extended to the infinite (i.e., $\phi C$ is a single pulse).

Furthermore, if the initial value of the chaotic time series is not required to be set up, the circuit to sample the input signal (as enclosed in the alternate long and short dash lines in each figure), as well as the clock $\phi C$, may be eliminated from the circuits shown in FIGS. 6 and 8 to 12.

Next, the SPICE simulation using ideal circuit elements is conducted in order to check the validity of the A/D converter circuit based on negative β-map of the present invention. While the SPICE simulation was conducted for all the circuits in FIGS. 6 and 8 to 12 to check their operation, the circuit shown in FIG. 12 becomes equivalent to the other circuits by adjusting the circuit parameters, so that the following describes the result obtained from the circuit in FIG. 12. In addition, although the value of β is usually estimated from the bit series after conversion (see Patent Documents 1 and 2, and Non-Patent Documents 1 to 4), the value of β was assumed to be known because the object here is to check the operation in an ideal condition. Here, note that $\beta = 5/3$, $s = 3$ in the following simulation.

First, the bit series BS ($x_{input}$) output from the circuit is verified whether it coincides with the theoretical value. Table 2 shows the comparison of the A/D-converted output bit series for the input signal $x_{input}$, obtained from the SPICE simulation of the circuit in FIG. 12 and from the theoretical equation above. Here, the bit length L=8. From Table 2, it can be found that the circuit of the present invention performs the A/D conversion based on negative β-map correctly.

TABLE 2

| Input $x_{input}$ | Quantization threshold θ | Output bit series BS $(x_{input})$ | | |
|---|---|---|---|---|
| | | SPICE | Theoretical value | Error |
| 0.1 | 1.21 | 01011101 | 01011101 | 0 |
| | 1.5 | 01011100 | 01011100 | 0 |
| | 1.79 | 01010010 | 01010010 | 0 |
| 0.5 | 1.21 | 01110111 | 01110111 | 0 |
| | 1.5 | 01001111 | 01001111 | 0 |
| | 1.79 | 01001111 | 01001111 | 0 |
| 0.8 | 1.21 | 01111010 | 01111010 | 0 |
| | 1.5 | 01100110 | 01100110 | 0 |
| | 1.79 | 00010100 | 00010100 | 0 |

Next, the evaluation is conducted of the conversion error of the decoded value of the output bit series obtained from the SPICE simulation of the circuit shown in FIG. 12. When the conversion bit length is L, the upper bound of the quantization error is given by the following (see Patent Document 1, and Non-Patent Documents 1 and 2).

$$\varepsilon_L(x) = |x_{input} - \hat{x}_L| \leq \frac{s\gamma^L}{2} \quad (63)$$

Using this, the bit length L=13 is adopted to provide $\varepsilon_L(x) \leq 2^{-9}$.

Figure 13:
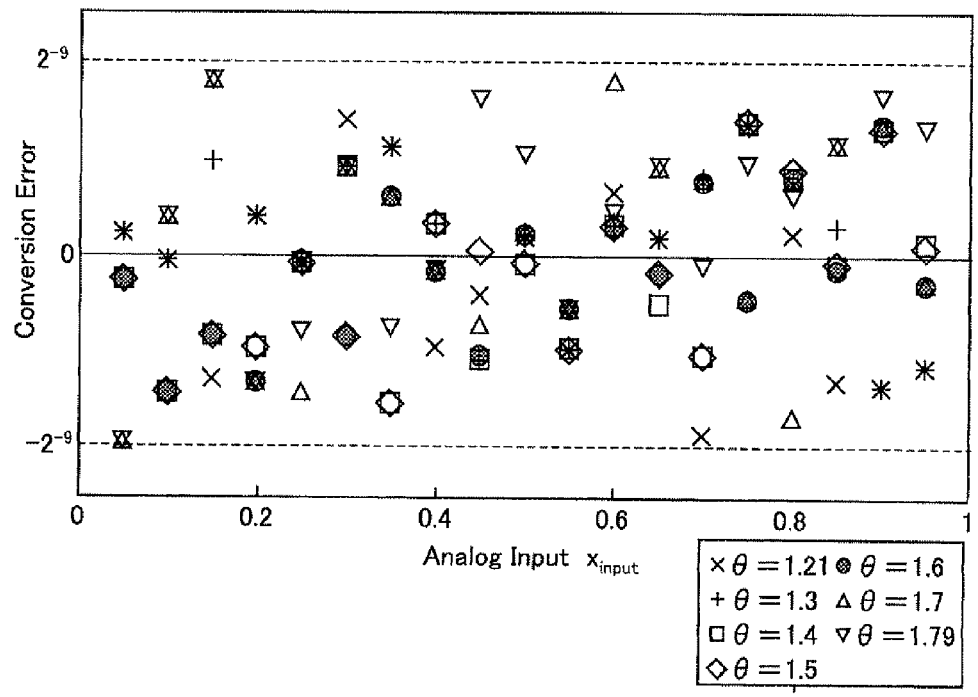
FIG. 13 shows conversion errors for different quantization thresholds θ when input signals $x_{input}$ are swept in the circuit in FIG. 12.
Figure 14:
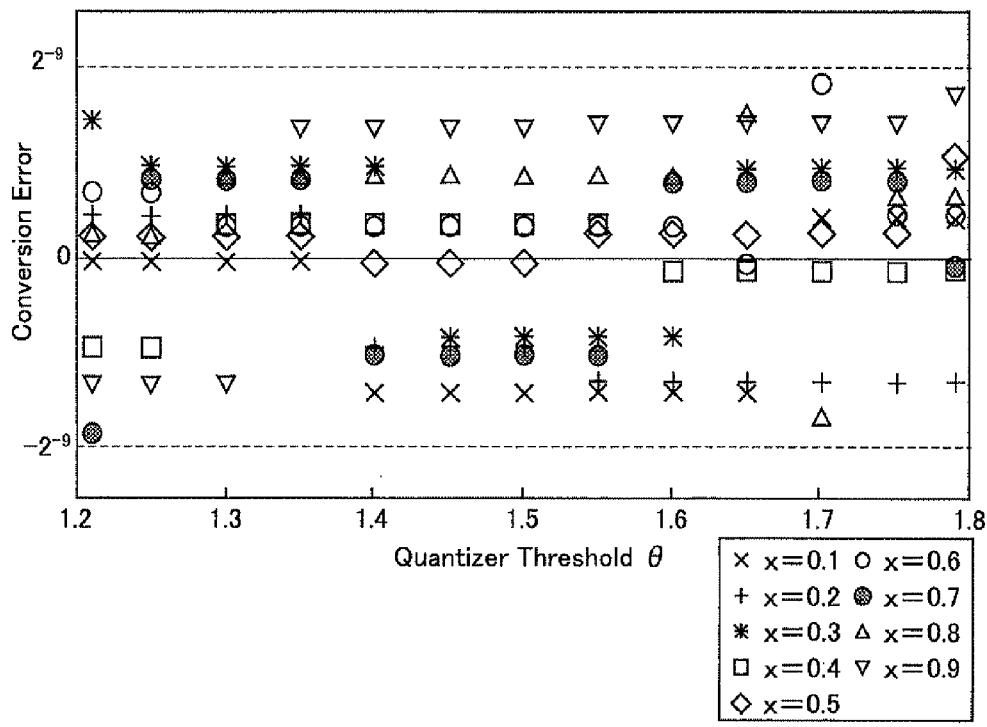
FIG. 14 shows conversion errors for different input signals $X_{input}$ when quantization thresholds θ are swept in the circuit in FIG. 12.

FIG. 13 shows results of evaluation of the conversion errors with different quantization thresholds θ for each input signal $x_{input}$. FIG. 14 shows results of the conversion errors obtained for different input signals $x_{input}$ while θ is varied. From these results, it was verified that, in the circuit of the present invention, the input signals $x_{input}$ are A/D converted correctly with greater conversion accuracy than the set-up while the quantization threshold θ is varied. In other words, it was verified that the circuit of the present invention has the robustness for variation in θ, which is the characteristic of the A/D conversion based on negative β-map.

Figure 15:
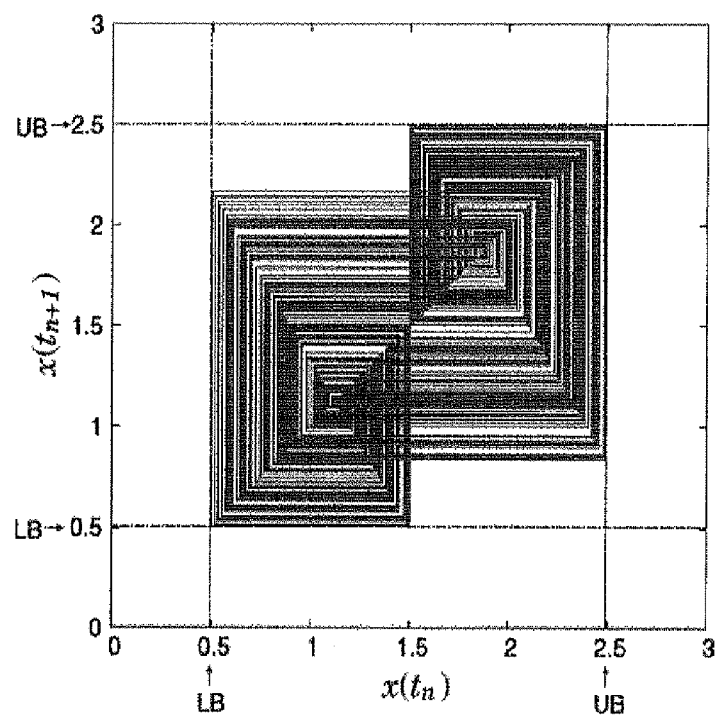
FIG. 15 shows an exemplary chaos attractor obtained from the SPICE simulation of the circuit in FIG. 12.

Furthermore, in the circuit shown in FIG. 12, the chaos generator was realized with the bit length L=∞. FIG. 15 shows an exemplary chaos attractor obtained from the SPICE simulation when θ=1.5. From Table 1, the invariant subinterval in this example is [LB=s−ν=0.5, UB=βs−ν=2.5]. As shown in FIG. 15, it is found that the chaos attractor remains within the invariant subinterval.

As described above, the present invention has been proposed the method of realizing the A/D converter that utilizes the data conversion method based on negative β-map using the discrete time integrator. The discrete time integrator is a core circuit element of the analog integrated circuit technology and is used in most cases in the integrated circuits. Accordingly, the A/D converter circuit based on negative β-map of the present invention is considered to be suitable for circuit integration. Herein, some of specific circuits have also been realized using the switched capacitor circuits as examples. In the A/D converter based on negative β-map of the present invention, the invariant subinterval expands at the ends of threshold tolerance, and thus the conversion accuracy is less likely to deteriorate as compared to the A/D converters based on positive β-map, even when the threshold approaches the ends of tolerance.

Moreover, the method has been proposed herein to apply the A/D converter that utilizes the data conversion method based on negative β-map as the chaos generator. Since the solution trajectory of the negative β-map is resultantly confined within the finite invariant subinterval, the chaos generator according to the present invention provides the robustness for non-ideal characteristics of the circuit elements or noises along with the stable operation.

Finally, with the SPICE circuit simulation using the ideal circuit elements, the checking has been conducted on the operation of the A/D converter circuit that utilizes the data conversion method based on negative β-map of the present invention to verify its validity.

The A/D converter based on negative β-map of the present invention provides the robustness for the change in the circuit characteristics due to the non-ideal characteristics or the like of the circuit elements and noises, so that it can contribute to the realization of compact, low-power-consuming, inexpensive, and highly-efficient A/D converter circuits or chaos generators, in particular to the circuit integration thereof. In addition, in terms of circuit integration, the A/D convertor circuits or chaos generators based on negative β-map of the present invention are suitable even for the semiconductor process on the order of sub-microns or below that is not suited for the integration of analog circuits due to their poor quality of matching or element characteristics of the circuit elements. Moreover, the A/D convertor circuits based on negative β-map of the present invention are applicable to a wide variety of circuits and systems, including various circuits used in systems that operate in the significantly changing environment, such as circuits for large-scale sensor networks, sensor node circuits for sensor dust, node circuits for emergency communications in large-scale disasters, various circuits utilized in the outer space, vehicle-mounted circuits, circuits for mobile robotics, circuits for wireless communication terminals, and the like. Furthermore, the chaos generators applying the A/D converter are widely available in the field of cryptology, chaos communications, random number generation, or chaos information processing.

The present invention should not be limited to the embodiments described above, and a number of variations are possible on the basis of the spirit of the present invention. These variations should not be excluded from the scope of the present invention.

INDUSTRIAL APPLICABILITY

The data conversion method based on negative β-map of the present invention provides the robustness for the change in environment or circuit characteristics, and contributes to the realization of compact, low-power-consuming, inexpensive, and highly-efficient A/D converter circuits or chaos generators.

What is claimed is:
1. An A/D converter for a data conversion method based on negative β-map comprising:
a discrete time integrator;
a quantizer $Q_\theta(\bullet)$ connected in series to the discrete time integrator; and
a feedback circuit including a coefficient multiplier connected from an output of the quantizer $Q_\theta(\bullet)$ to an input of the discrete time integrator,
wherein the A/D converter is configured to convert data using negative β-map, and wherein the discrete time integrator has an amplification coefficient s and a damping factor β, and the feedback circuit comprises a β coefficient multiplier and a logic inverter.

2. The A/D converter for a data conversion method based on negative β-map according to claim 1, wherein the A/D converter is implemented using a switched capacitor integrator circuit.

3. The A/D converter for a data conversion method based on negative β-map according to claim 1, wherein the A/D converter is configured as a chaos generator by extending a bit length L thereof to the infinite.

4. The A/D converter for a data conversion method based on negative β-map according to claim 3, wherein a chaotic time series having an initial value $x_{input}$ is obtained by operating an A/D converter based on negative β-map R (•) to sample an input signal $x_{input}$ at discrete time $t_1$, and repeat the mapping L-times to obtain a conversion bit series BS ($x_{input}$) having the bit length L, and by extending the bit length to the infinite (L=∞) in the operation.

5. The A/D converter for a data conversion method based on negative β-map according to claim 4, wherein, if the initial value is not required to be set up, $-\infty<n<\infty$ at the discrete time $t_n$ is provided wherein the circuit subjected to sampling of the input signal is eliminated to configure a compact chaos generator.

6. An A/D converter for a data conversion method based on negative β-map comprising:
a discrete time integrator;
a quantizer $Q_\theta^S(•)$ connected in series to the discrete time integrator; and
a feedback circuit including a coefficient multiplier connected from an output of the quantizer $Q_\theta^S(•)$ to an input of the discrete time integrator,
wherein the A/D converter is configured to convert data using negative β-map, and wherein the discrete time integrator has a damping factor β, and the feedback circuit comprises a β coefficient multiplier and a logic inverter.

7. The A/D converter for a data conversion method based on negative β-map according to claim 6 wherein the A/D converter is implemented using a switched capacitor integrator circuit.

8. The A/D converter for a data conversion method based on negative β-map according to claim 6, wherein the A/D converter is configured as a chaos generator by extending a bit length L thereof to the infinite.

9. The A/D converter for a data conversion method based on negative β-map according to claim 8, wherein a chaotic time series having an initial value $x_{input}$ is obtained by operating an A/D converter based on negative β-map R (•) to sample an input signal $x_{input}$ at discrete time $t_1$, and repeat the mapping L-times to obtain a conversion bit series BS ($x_{input}$) having the bit length L, and by extending the bit length to the infinite (L=∞) in the operation.

10. The A/D converter for a data conversion method based on negative β-map according to claim 9, wherein, if the initial value is not required to be set up, $-\infty<n<\infty$ at the discrete time $t_n$ is provided wherein the circuit subjected to sampling of the input signal is eliminated to configure a compact chaos generator.

11. An A/D converter for a data conversion method based on negative β-map comprising:
a discrete time integrator;
a quantizer $Q_\theta(•)$ connected in series to the discrete time integrator; and
a feedback circuit including a coefficient multiplier connected from an output of the quantizer $Q_\theta(•)$ to an input of the discrete time integrator,
wherein the A/D converter is configured to convert data using negative β-map, and wherein the discrete time integrator has an amplification coefficient s and a damping factor β, and the feedback circuit comprises a (β−1) coefficient multiplier.

12. The A/D converter for a data conversion method based on negative β-map according to claim 11 wherein the A/D converter is implemented using a switched capacitor integrator circuit.

13. The A/D converter for a data conversion method based on negative β-map according to claim 11, wherein the A/D converter is configured as a chaos generator by extending a bit length L thereof to the infinite.

14. The A/D converter for a data conversion method based on negative β-map according to claim 13, wherein a chaotic time series having an initial value $x_{input}$ is obtained by operating an A/D converter based on negative β-map R (•) to sample an input signal $x_{input}$ at discrete time $t_1$, and repeat the mapping L-times to obtain a conversion bit series BS ($x_{input}$) having the bit length L, and by extending the bit length to the infinite (L=∞) in the operation.

15. The A/D converter for a data conversion method based on negative β-map according to claim 14, wherein, if the initial value is not required to be set up, $-\infty<n<\infty$ at the discrete time $t_n$ is provided wherein the circuit subjected to sampling of the input signal is eliminated to configure a compact chaos generator.

16. An A/D converter for a data conversion method based on negative β-map comprising:
a discrete time integrator;
a quantizer $Q_\theta^S(•)$ connected in series to the discrete time integrator; and
a feedback circuit including a coefficient multiplier connected from an output of the quantizer $Q_\theta^S(•)$ to an input of the discrete time integrator,
wherein the A/D converter is configured to convert data using negative β-map, and wherein the discrete time integrator has a damping factor β, and the feedback circuit comprises a (β−1) coefficient multiplier.

17. The A/D converter for a data conversion method based on negative β-map according to claim 16 wherein the A/D converter is implemented using a switched capacitor integrator circuit.

18. The A/D converter for a data conversion method based on negative β-map according to claim 16, wherein the A/D converter is configured as a chaos generator by extending a bit length L thereof to the infinite.

19. The A/D converter for a data conversion method based on negative β-map according to claim 18, wherein a chaotic time series having an initial value $x_{input}$ is obtained by operating an A/D converter based on negative β-map R (•) to sample an input signal $x_{input}$ at discrete time $t_1$, and repeat the mapping L-times to obtain a conversion bit series BS ($x_{input}$) having the bit length L, and by extending the bit length to the infinite (L=∞) in the operation.

20. The A/D converter for a data conversion method based on negative β-map according to claim 19, wherein, if the initial value is not required to be set up, $-\infty<n<\infty$ at the discrete time $t_n$ is provided wherein the circuit subjected to sampling of the input signal is eliminated to configure a compact chaos generator.

* * * * *